(12) United States Patent
Liu et al.

(10) Patent No.: US 8,664,717 B2
(45) Date of Patent: Mar. 4, 2014

(54) SEMICONDUCTOR DEVICE WITH AN OVERSIZED LOCAL CONTACT AS A FARADAY SHIELD

(75) Inventors: Yanxiang Liu, Wappinger Falls, NY (US); Young Way Teh, Wappinger Falls, NY (US); Vara Vakada, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 53 days.

(21) Appl. No.: 13/346,164

(22) Filed: Jan. 9, 2012

(65) Prior Publication Data

US 2013/0175617 A1 Jul. 11, 2013

(51) Int. Cl.
*H01L 29/66* (2006.01)

(52) U.S. Cl.
USPC .......................... 257/340; 257/659

(58) Field of Classification Search
USPC .................................. 257/340, 659
See application file for complete search history.

(56) References Cited

U.S. PATENT DOCUMENTS

| | | | |
|---|---|---|---|
| 4,839,594 A | 6/1989 | Misic et al. | |
| 5,291,152 A | 3/1994 | Seale | |
| 5,726,523 A | 3/1998 | Popov et al. | |
| 6,215,152 B1 | 4/2001 | Hebert | |
| 6,420,952 B1 | 7/2002 | Redilla | |
| 6,534,843 B2 | 3/2003 | Acosta et al. | |
| 6,653,691 B2 | 11/2003 | Baliga | |
| 6,685,799 B2 | 2/2004 | Davis et al. | |
| 6,762,088 B2 | 7/2004 | Acosta et al. | |
| 7,119,415 B2 * | 10/2006 | Norstrom et al. | 257/536 |
| 7,223,321 B1 | 5/2007 | Comendant et al. | |
| 7,307,314 B2 | 12/2007 | Babcock et al. | |
| 7,413,673 B2 | 8/2008 | Lohokare et al. | |
| 7,741,567 B2 | 6/2010 | Beddingfield et al. | |
| 7,796,403 B2 | 9/2010 | Coakley | |
| 8,049,119 B2 | 11/2011 | Beddingfield et al. | |
| 8,053,873 B2 | 11/2011 | Chauhan et al. | |
| 8,071,935 B2 | 12/2011 | Besko et al. | |
| 2005/0280085 A1 | 12/2005 | Babcock et al. | |
| 2006/0128085 A1 | 6/2006 | Shibib et al. | |

OTHER PUBLICATIONS

Brech et al., "Record Efficiency and Gain at 2.1 GHz of High Power RF Transistors for Cellular and 3G Base Stations," 2003 IEEE, pp. 359-362.

* cited by examiner

*Primary Examiner* — Mark Prenty
(74) *Attorney, Agent, or Firm* — Amerson Law Firm, PLLC

(57) ABSTRACT

This application is directed to a semiconductor device with an oversized local contact as a Faraday shield, and methods of making such a semiconductor device. One illustrative device disclosed herein includes a transistor comprising a gate electrode and a source region, a source region conductor that is conductively coupled to the source region, a Faraday shield positioned above the source region conductor and the gate electrode and a first portion of a first primary metallization layer for an integrated circuit device positioned above and electrically coupled to the Faraday shield.

23 Claims, 4 Drawing Sheets

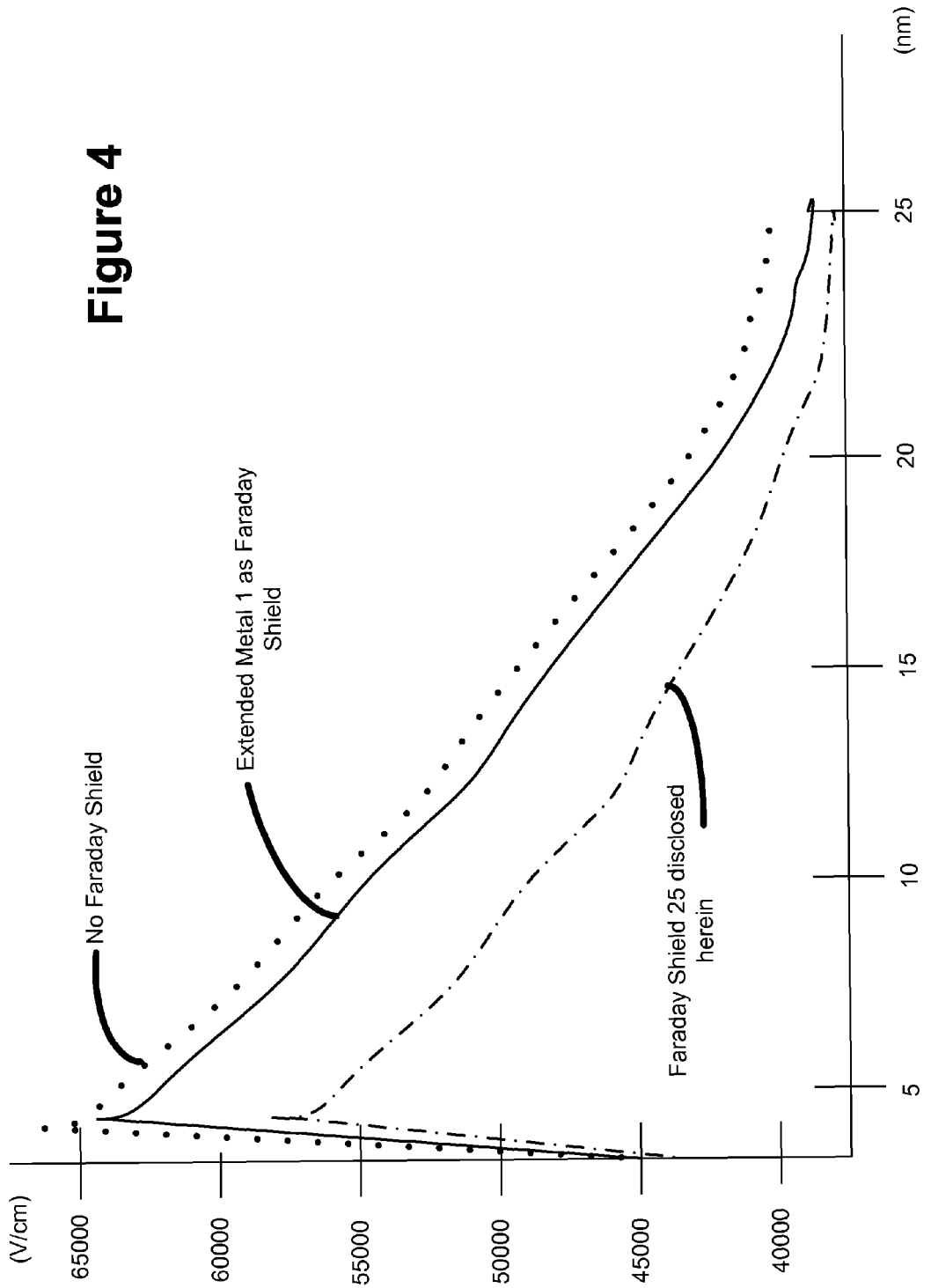

SEMICONDUCTOR DEVICE WITH AN OVERSIZED LOCAL CONTACT AS A FARADAY SHIELD

BACKGROUND OF THE INVENTION

1. Field of the Invention

Generally, the present disclosure relates to the manufacturing of sophisticated semiconductor devices, and, more specifically, to a semiconductor device with an oversized local contact as a Faraday shield, and methods of making such a device.

2. Description of the Related Art

RF power amplifiers are key components in base stations, broadcast transmitters and microwave applications. Such power amplifiers can typically handle a wide range of signal types such as GSM, EDGE, W-CDMA, WiMAX and DVD-T. LDMOS (Laterally Diffused Metal Oxide Semiconductor) devices have been the technology of choice for RF power amplifiers for over a decade because of their excellent power capabilities, gain, efficiency and reliability. In an RF LDMOS device, a Faraday shield is usually employed for two purposes: (1) to screen the gate for drain potential and to move the high electric field away from the gate edge in an attempt to mitigate hot carrier injection at the drain edge under the gate; and (2) to reduce the reverse transfer capacitance ($C_{gd}$—gate to drain capacitance), thereby improving RF performance. As device dimensions continue to shrink, it becomes very important to develop devices with better shielding characteristics that can be manufactured in a cost-efficient and timely manner.

The present disclosure is directed to a semiconductor device with an oversized local contact as a Faraday shield, and methods of making such a semiconductor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a semiconductor device with an oversized local contact as a Faraday shield, and methods of making such a semiconductor device. One illustrative device disclosed herein includes a transistor comprising a gate electrode and a source region, a source region conductor that is conductively coupled to the source region, a Faraday shield positioned above the source region conductor and the gate electrode and a first portion of a first primary metallization layer for an integrated circuit device positioned above and electrically coupled to the Faraday shield.

In another illustrative example, a device is disclosed that includes a transistor comprising a gate electrode and a source region, wherein the gate electrode has a drain-side edge, a source region conductor that is conductively coupled to the source region, a Faraday shield positioned above the source region conductor and the gate electrode, wherein a drain-side edge of the Faraday shield extends beyond the drain-side edge of the gate electrode when viewed from above, and a first portion of a first primary metallization layer for the integrated circuit device positioned above and electrically coupled to the Faraday shield.

BRIEF DESCRIPTION OF THE DRAWINGS

The disclosure may be understood by reference to the following description taken in conjunction with the accompanying drawings, in which like reference numerals identify like elements, and in which:

FIG. 4 is a graphical depiction of the effectiveness of one illustrative embodiment of a Faraday shield as disclosed.

Figure 1:
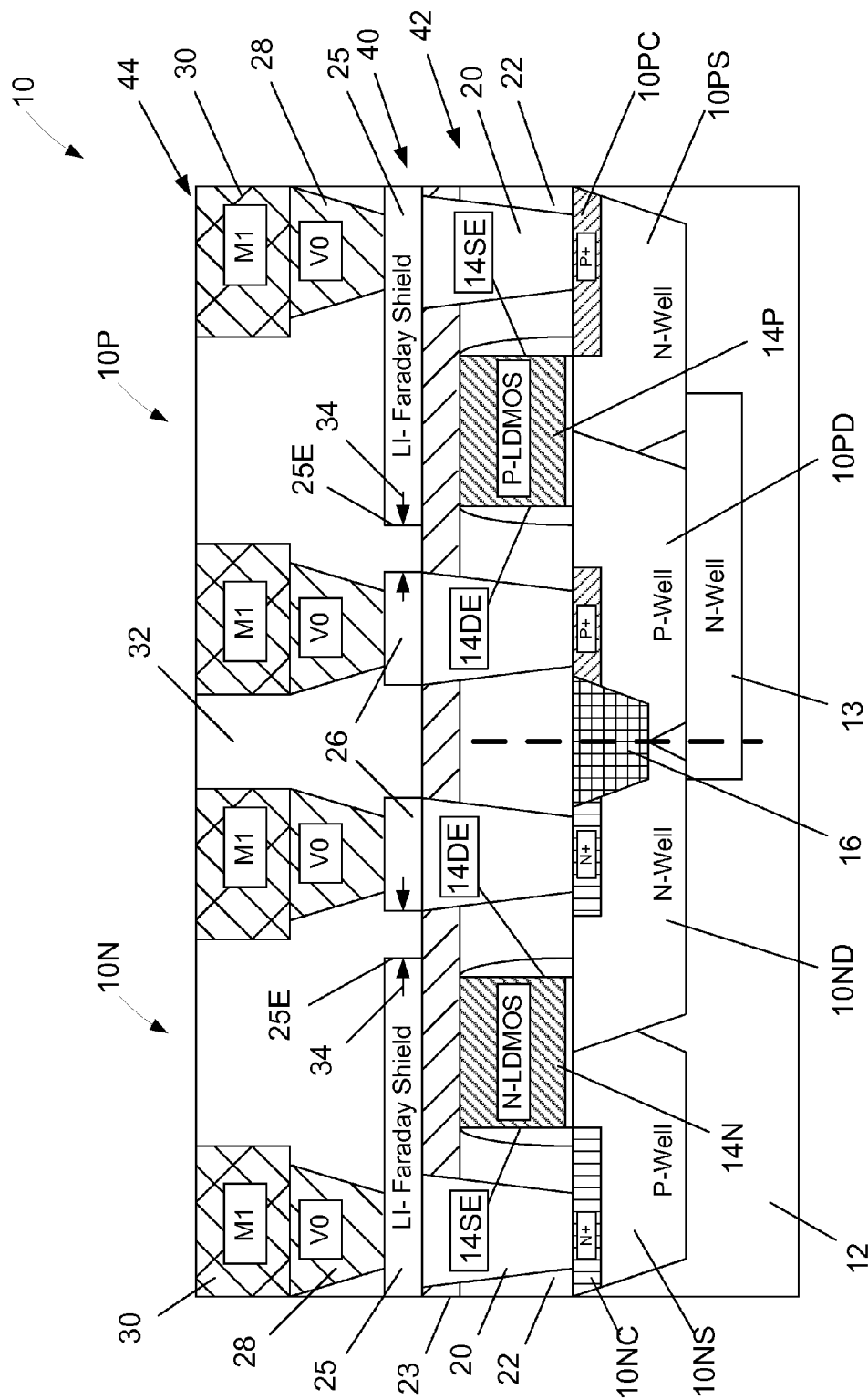
FIG. 1 is a cross-sectional view of one illustrative embodiment of an illustrative LDMOS device disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a semiconductor device with an oversized local contact as a Faraday shield, and methods of making such a semiconductor device. As will be readily apparent to those skilled in the art upon a complete reading of the present application, the present method is applicable to a variety of semiconductor devices, including, but not limited to, LDMOS devices, microwave transistors, power amplifiers (both N-type and P-type versions of such devices), and the use of such semiconductor devices in a variety of applications, such as, for example, RF/microwave power amplifiers, avionics, radar transmission systems, cellular base stations, etc. The inventions disclosed herein will be described with reference to illustrative LDMOS devices; however, as noted above, the inventions disclosed herein have application in a wide variety of applications and may be employed in a variety of different semiconductor devices. Thus, the inventions disclosed herein should not be limited to any particular type of semiconductor device or any particular application. With reference to the attached drawings, various illustrative embodiments of the devices and methods disclosed herein will now be described in more detail.

FIG. 1 is a simplified cross-sectional view of an illustrative LDMOS semiconductor device 10 at an early stage of manufacturing. The LDMOS device 10 may be either an N-type LDMOS device 10N or a P-type LDMOS device 10P. The LDMOS device 10 is formed above an illustrative bulk semiconducting substrate 12 that may be comprised of silicon or other semiconducting materials. The substrate 12 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The illustrative LDMOS device 10 depicted herein is intended to be representative in nature of any of a variety of different configurations and variations of LDMOS devices that are generally known to those skilled in the art. As noted above, after a complete reading of the present application, those skilled in the art will readily appreciate that the inventions disclosed herein may be applied to any of a variety of different semiconductor designs. Accordingly, the present inventions should not be considered as limited to any type or configuration of any particular type of semiconductor device.

Figure 2:
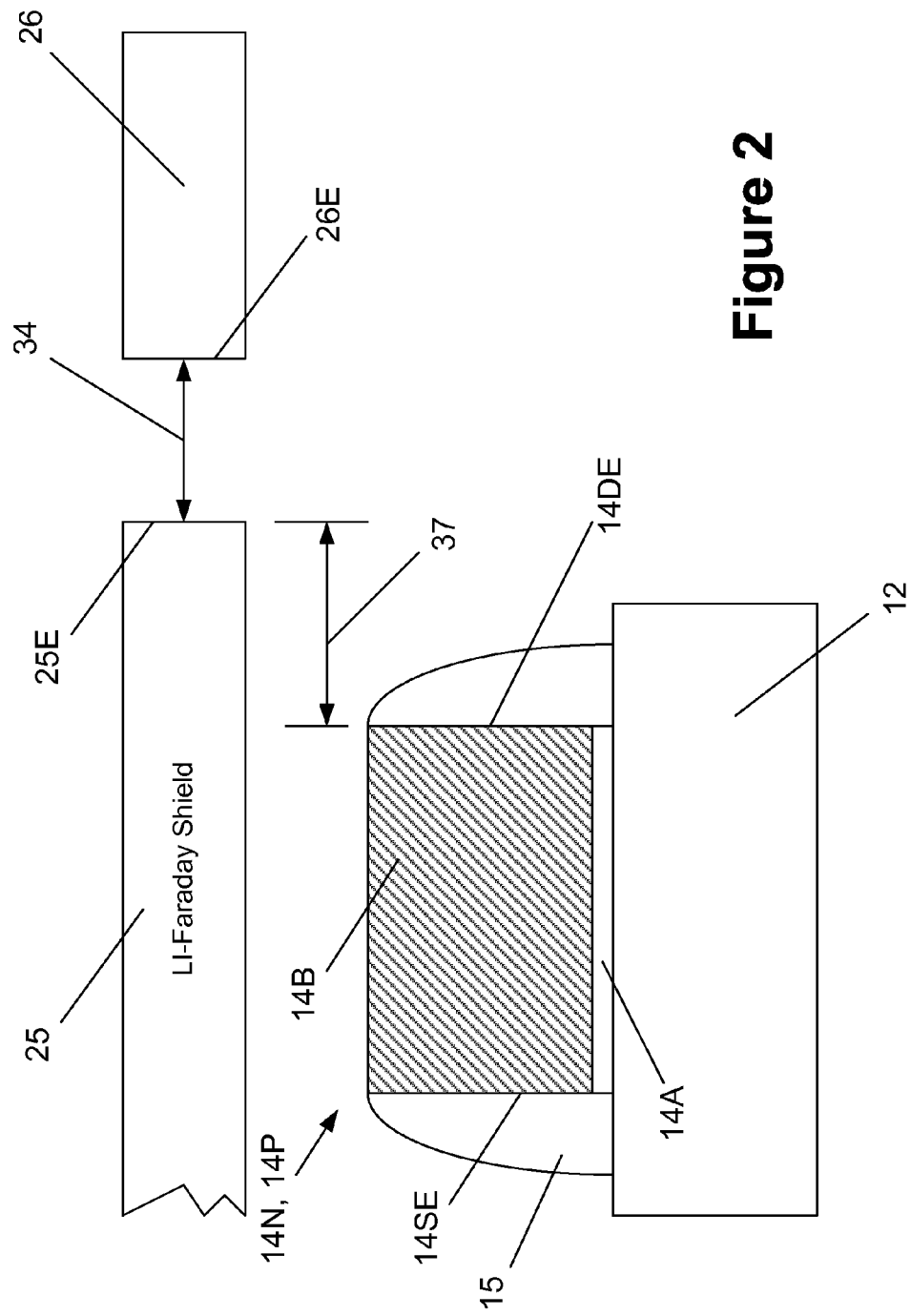
FIG. 2 is an enlarged cross-sectional view of a portion of the illustrative LDMOS device depicted in FIG. 1.

As shown in FIG. 1, the device 10 comprises a shallow trench isolation structure 16 formed in the substrate 10. The illustrative N-type LDMOS device 10N has an illustrative gate structure 14N formed above the substrate 12. The illustrative P-type LDMOS device 10P has an illustrative gate structure 14P formed above the substrate 12. As shown in FIG. 2, the gate structure 14N, 14P is generally comprised of a gate insulation layer 14A and a gate electrode 14B, both of which may be comprised of a variety of materials and manufactured using a variety of known techniques. For example, the gate insulation layer 14A may be comprised of a variety of different materials, such as, for example, silicon dioxide, a so-called high-k (k greater than 10) insulation material, etc. Similarly, the gate electrode 14B may also be of a material such as polysilicon or amorphous silicon, or it may be comprised of one or more metal layers that act as the gate electrode 14B. As will be recognized by those skilled in the art after a complete reading of the present application, the gate structures 14N, 14P of the device 10 depicted in the drawings, i.e., the gate insulation layer 14A and the gate electrode 14B, are intended to be representative in nature. That is, the gate structures 14N, 14P may be comprised of a variety of different materials and they may have a variety of configurations, and the gate structures 14N, 14P may be made using either so-called "gate-first" or "gate-last" techniques. The materials of construction for the gate structure 14N of the N-type LDMOS device 10N may be different than those employed on the P-type LDMOS device 10P. Illustrative sidewall spacers 15 comprised of, for example, silicon nitride, are typically formed adjacent the gate electrode structures 14N, 14P to protect and electrically isolate the gate electrode structure. With reference to FIGS. 1 and 2, the gate electrodes 14B of the gate structures 14N, 14P have a source-side edge 14SE and a drain-side edge 14DE. The gate structures 14N, 14P are formed in a first layer of insulating material 22.

A plurality of doped regions are formed in the substrate 12 as is customary for LDMOS devices. The various doped regions may be formed by using various masking layers and performing various ion implantation processes, all of which are known to those skilled in the art. In one illustrative example, the N-type LDMOS device 10N includes a P-doped source region IONS and an N-doped drain region 10ND, while the P-type LDMOS device 10P includes an N-doped source region LOPS and a P-doped drain region 10PD. Doped contact region 10NC and 10PC are formed for the N-type LDMOS device 10N and the P-type LDMOS device 10P, respectively. In the depicted embodiment, the doped contact regions 10NC, 10PC for the source regions IONS, LOPS (respectively) extend to the source-side edge 14SE of the gate electrode 14B of the N-type LDMOS device 10N and P-type LDMOS device 10P, respectively. An N-doped so-called sealing well 13 may be provided for the P-type LDMOS device 10P.

In one illustrative embodiment, a second layer of insulating material 23 may be formed above the gate structures 14N, 14P and the first layer of insulating material 22. The second layer of insulating material 23 may be comprised of a different material than that of the first layer of insulating material 22, although that is not required to practice at least some aspects of the present invention. In one illustrative embodiment, the second layer of insulating material 23 may be a layer of silicon nitride, while the first layer of insulating material 22 may be made of silicon dioxide. The second layer of insulating material 23 may serve a variety of purposes in addition to its general insulation function. For example, the second layer of insulating material 23 may be used as a polish-stop layer or an etch stop layer in subsequent processing operations that are performed to form various conductive structures for the device 10.

The device 10 also includes a plurality of source/drain region conductors 20 that are conductively coupled to the source/drain regions of the N-type LDMOS device 10N and the P-type LDMOS device 10P are formed using traditional fabrication techniques. Within the industry, the source/drain region conductors 20 may sometimes be referred to as "trench silicide" regions. However, as will be recognized by those skilled in the art after a complete reading of the present application, the source/drain region conductors 20 may be of any shape or configuration and they may be comprised of any material as long as they provide a conductive connection to the source/drain regions. The source/drain region conductors 20 may be comprised of a variety of materials, e.g., tungsten, titanium nitride, etc. The size, shape and number of the source/drain region conductors 20 may vary depending upon the particular application. In one illustrative embodiment, the source/drain region conductors 20 may be generally cylindrical post-like structures. In the depicted example, the source/drain region conductors 20 extend through both the first layer of insulating material 22 and the second layer of insulating material 23.

Next, in one illustrative embodiment, a Faraday shield 25 and drain-side conductive contacts 26 are formed for both the N-type LDMOS device 10N and the P-type LDMOS device 10P. In one illustrative embodiment, the Faraday shield 25 and drain-side conductive contacts 26 are formed in a first metallization layer 40 for the device 10 above the metallization level 42 that contains the source/drain region conductors 20. In general, it is believed that many in the industry refer to the metallization layer 40 as the "contact-level" or the "local interconnect level." In general, the local interconnect level 40 is not a general wiring layer. The local interconnect level 40 is typically employed to vertically connect the source/drain region conductors 20 and the first general wiring layer (typically designated "M1" and described more fully below) for the integrated circuit product that will contain the device 10. However, in some cases, the local interconnect level 40 may be used to connect or make short runs to adjacent or near-by devices, thus the term "local interconnect," the contacts formed in the local interconnect level 40 are not employed to run wiring for the integrated circuit product over great distances. The Faraday shield 25 and drain-side conductive contacts 26 may be comprised of a variety of materials, e.g., copper, tungsten, titanium nitride, etc., and they may be formed using traditional techniques, such as damascene techniques, or by deposition of an appropriate layer of material and thereafter patterning that layer of material. The Faraday shield 25 and drain-side conductive contacts 26 may have a thickness that varies depending upon the particular application, e.g., 20-100 nm. The size, shape and number of the drain-side conductive contacts 26 may vary depending upon the particular application.

Also depicted in FIG. 1 are a plurality of conductive vias 28 and a plurality of metal-1 portions or lines 30 that are formed in a layer of insulting material 32 using known techniques. The conductive vias 28 conductively couple the Faraday shield to the illustrative metal line 30 positioned thereabove. The metallization layer 44 containing the lines 30 is believed to be generally known in the industry as the so-called "metal-1" metallization layer. The metallization layer 44 is the first of perhaps many general metallization layers that may be formed above the device 10. The various lines and structures formed in the metallization layer 44 are generally used to establish electrical conductivity over relatively long distances on an integrated circuit product. The conductive vias 28 and lines 30 may be comprised of a variety of different materials, e.g., copper, tungsten, etc. In the depicted embodiment, the illustrative Faraday shield 25 is positioned below the metal-1 wiring layer 44 and is only connected to the metal-1 wiring layer via the conductive vias 28.

Figure 3:
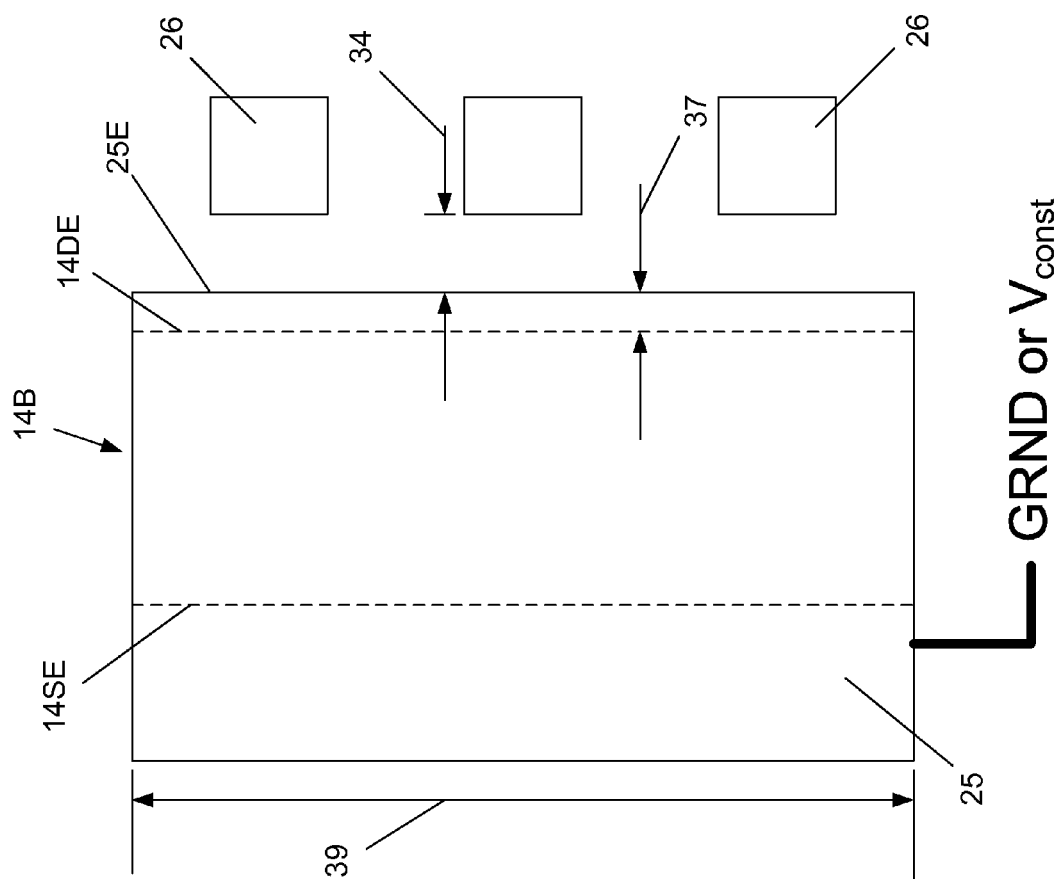
FIG. 3 is an enlarged plan view of a portion of the illustrative LDMOS device depicted in FIG. 1.

With reference to FIGS. 2 and 3, various other aspects of the present invention will be further described, wherein FIG. 2 is an enlarged cross-sectional view and FIG. 3 is an enlarged plan view of portions of the device 10. As shown in these drawings, in one illustrative example, the drain side edge 25E of the Faraday shield 25 extends from above the source region of the transistor to at least the drain-side edge 14DE of the gate electrode 14B. In some applications, the Faraday shield 25 is sized and configured such that it extends a distance 37 beyond the drain-side edge 14DE of the gate electrode 14B and is positioned a distance 34 from an edge 26E of the drain-side contacts 26. The magnitude of the dimensions 37 and 34 may vary depending upon the particular application, and there are "trade-off" considerations to be evaluated in setting these distances. In general, the greater the distance 37 that the Faraday shield overlaps the gate electrode 14B (in cases where it does overlap), the better will be the shielding. However, as the distance 34 is decreased, the capacitance between the Faraday shield 25 and the conductive contacts 26 may also become problematic. In one illustrative embodiment, the dimension 37 may range from about 0-500 nm, while the distance 34 may be about 20-1000 nm. In general, using current day technology for LDMOS devices intended for use in power amplifier applications, it is believed the distance 34 should not be less than about 5-10 nm. Please note the view depicted in FIG. 2 applies to the gate structure 14N for the N-type LDMOS device 10N shown in FIG. 1. The view depicted in FIG. 2 applies equally to the gate structure 14P for the P-type LDMOS device 10P as well but it would be as viewed from the opposite end of the gate structure from the view that is depicted in FIG. 1. As shown in FIG. 3, in one illustrative embodiment, the Faraday shield 25 may have a length dimension 39 that corresponds to a gate width of the transistor. In operation, the Faraday shield may be coupled to electrical ground (GRND) or a constant reference voltage ($V_{const}$).

Modeling of the device 10 disclosed herein shows a marked improvement in device performance. Three situations were modeled for an LDMOS device: (1) no Faraday shield; (2) a Faraday shield implemented by extending the metal-1 wiring layer above the gate electrode; and (3) an illustrative embodiment of a Faraday shield disclosed herein (wherein the vertical distance between metal-1 portions or lines 30 and the gate electrode 14B was about 130 nm, the vertical distance between the Faraday shield 25 was about 26 nm, the dimension 37 was about 50 nm and the dimension 34 was about 100 nm). The modeling determined the electric field perpendicular to the channel region at the drain-side edge 14DE of the gate electrode 14B at various depths into the substrate 12. The results are depicted in FIG. 4 where the magnitude of the electrical field is plotted on the vertical axis (V/cm) and depth into the silicon substrate is plotted on the horizontal axis (nm). As can be seen therein, using the novel arrangement disclosed herein, the electrical field is greatly reduced for the transistor at the drain-side of the gate electrode at all depths into the substrate as compared to the electrical field present when using either option 1 or 2 above. Additionally, the modeling predicted the reverse transfer capacitance ($C_{gd}$–gate to drain capacitance–fF/μm) for cases 1, 2 and 3 to be 0.584. 0.558 and 0.539, respectively. Thus, the reduction in the reverse transfer capacitance for case 2 (extended metal-1 shield) relative to case 1 (no shield) is 0.026 fF/μm, while the reduction in the reverse transfer capacitance for case 3 (Faraday shield disclosed herein relative to case 1 (no shield)) is 0.045 fF/μm—a reduction in the reverse transfer capacitance of over 73% (0.045/0.026=173%) while using the novel Faraday shield disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. An integrated circuit device, comprising:
   a transistor comprising a gate electrode and a source region;
   a source region conductor that is conductively coupled to said source region;
   a Faraday shield positioned above said source region conductor and said gate electrode;

a first portion of a first primary metallization layer for said integrated circuit device positioned above an upper surface of said Faraday shield; and a conductive via that is positioned between said Faraday shield and said first portion of said first primary metallization layer, wherein said conductive via is in physical contact with said upper surface of said Faraday shield.

2. The device of claim 1, wherein said transistor has a gate width and wherein said Faraday shield has a first dimension that is equal to or greater than said gate width.

3. The device of claim 1, wherein said gate electrode has a drain-side edge and wherein a drain-side edge of said Faraday shield is positioned even with or extends beyond said drain-side edge of said gate electrode when viewed from above.

4. The device of claim 1, wherein said gate electrode has a drain-side edge and wherein a drain-side edge of said Faraday shield extends beyond said drain-side edge of said gate electrode when viewed from above by a distance ranging from 0-500 nm.

5. The device of claim 1, wherein said transistor further comprises a drain region and wherein the device further comprises:
a drain region conductor that is conductively coupled to said drain region; and
a local contact that is positioned above and conductively coupled to said drain region conductor, said local contact being in the same metallization level as said Faraday shield, wherein a drain side edge of said Faraday shield is spaced apart from said local contact by a distance of at least 5-10 nm.

6. The device of claim 1, wherein said Faraday shield has a thickness of about 20-100 nm.

7. The device of claim 5, further comprising a second portion of said first primary metallization layer for said integrated circuit device position above and electrically coupled to said local contact.

8. The device of claim 1, wherein said gate electrode is positioned in a first layer of insulating material and wherein the device further comprises a second layer of insulating material positioned above said first layer of insulating material, wherein a portion of said second layer of insulating material is positioned between said gate electrode and said Faraday shield.

9. The device of claim 8, wherein said first layer of insulating material and said second layer of insulating material are comprised of different materials.

10. The device of claim 1, wherein said conductive via is in physical contact with said first portion of said first primary metallization layer.

11. The device of claim 1, wherein said transistor is an LDMOS transistor.

12. An integrated circuit device, comprising:
a transistor comprising a gate electrode and a source region, said gate electrode having a drain-side edge;
a source region conductor that is conductively coupled to said source region;
a Faraday shield positioned above said source region conductor and said gate electrode, wherein a drain-side edge of said Faraday shield extends beyond said drain-side edge of said gate electrode when viewed from above;
a first portion of a first primary metallization layer for said integrated circuit device positioned above an upper surface of said Faraday shield; and
a conductive via that is positioned between said Faraday shield and said first portion of said first primary metallization layer, wherein said conductive via is in physical contact with said upper surface of said Faraday shield.

13. The device of claim 12, wherein said transistor has a gate width and wherein said Faraday shield has a first dimension that is equal to or greater than said gate width.

14. The device of claim 12, wherein said transistor further comprises a drain region and wherein the device further comprises:
a drain region conductor that is conductively coupled to said drain region; and
a local contact that is positioned above and conductively coupled to said drain region conductor, said local contact being in the same metallization level as said Faraday shield, wherein said drain-side edge of said Faraday shield is spaced apart from said local contact by a distance of at least 5-10 nm.

15. The device of claim 14, further comprising a second portion of said first primary metallization layer for said integrated circuit device positioned above and electrically coupled to said local contact.

16. The device of claim 12, wherein said gate electrode is positioned in a first layer of insulating material and wherein the device further comprises a second layer of insulating material positioned above said first layer of insulating material, wherein a portion of said second layer of insulating material is positioned between said gate electrode and said Faraday shield.

17. The device of claim 12, wherein said conductive via is in physical contact with said first portion of said first primary metallization layer.

18. An integrated circuit device, comprising:
a transistor comprising a gate electrode, a source region and a drain region, said gate electrode having a drain-side edge;
a source region conductor that is conductively coupled to said source region;
a drain region conductor that is conductively coupled to said drain region;
a Faraday shield positioned above said source region conductor and said gate electrode, wherein a drain-side edge of said Faraday shield extends beyond said drain-side edge of said gate electrode when viewed from above;
a local contact that is positioned above and conductively coupled to said drain region conductor, said local contact being in the same metallization level as said Faraday shield, wherein said drain-side edge of said Faraday shield is spaced apart from said local contact; and
a first portion of a first primary metallization layer for said integrated circuit device positioned above and electrically coupled to said Faraday shield.

19. An integrated circuit device, comprising:
a transistor comprising a gate electrode and a source region, wherein said transistor has a gate width;
a source region conductor that is conductively coupled to said source region;
a Faraday shield positioned above said source region conductor and said gate electrode, wherein said Faraday shield has a first dimension that is equal to or greater than said gate width; and
a first portion of a first primary metallization layer for said integrated circuit device positioned above and electrically coupled to said Faraday shield.

20. An integrated circuit device, comprising:
a transistor comprising a gate electrode and a source region, wherein said gate electrode is positioned in a first layer of insulating material;
a source region conductor that is conductively coupled to said source region;

a Faraday shield positioned above said source region conductor and said gate electrode;

a second layer of insulating material positioned above said first layer of insulating material, wherein a portion of said second layer of insulating material is positioned between said gate electrode and said Faraday shield; and a first portion of a first primary metallization layer for said integrated circuit device positioned above and electrically coupled to said Faraday shield.

21. An integrated circuit device, comprising:

a transistor comprising a gate electrode, a source region and a drain region;

a source region conductor that is conductively coupled to said source region;

a drain region conductor that is conductively coupled to said drain region;

a Faraday shield positioned above said source region conductor and said gate electrode;

a first portion of a first primary metallization layer for said integrated circuit device positioned above and electrically coupled to said Faraday shield; and a local contact that is positioned above and conductively coupled to said drain region conductor, said local contact being in the same metallization level as said Faraday shield, wherein a drain side edge of said Faraday shield is spaced apart from said local contact by a distance of at least 5-10 nm.

22. An integrated circuit device, comprising:

a transistor comprising a gate electrode and a source region, said gate electrode having a drain-side edge, wherein said transistor has a gate width;

a source region conductor that is conductively coupled to said source region;

a Faraday shield positioned above said source region conductor and said gate electrode, wherein a drain-side edge of said Faraday shield extends beyond said drain-side edge of said gate electrode when viewed from above and wherein said Faraday shield has a first dimension that is equal to or greater than said gate width; and a first portion of a first primary metallization layer for said integrated circuit device positioned above and electrically coupled to said Faraday shield.

23. An integrated circuit device, comprising:

a transistor comprising a gate electrode and a source region, said gate electrode having a drain-side edge, wherein said gate electrode is positioned in a first layer of insulating material;

a source region conductor that is conductively coupled to said source region;

a second layer of insulating material positioned above said first layer of insulating material;

a Faraday shield positioned above said source region conductor and said gate electrode, wherein a drain-side edge of said Faraday shield extends beyond said drain-side edge of said gate electrode when viewed from above, wherein a portion of said second layer of insulating material is positioned between said gate electrode and said Faraday shield; and a first portion of a first primary metallization layer for said integrated circuit device positioned above and electrically coupled to said Faraday shield.

* * * * *